United States Patent [19]

Dickens

[11] 3,842,360

[45] Oct. 15, 1974

[54] PARAMETRIC AMPLIFIER

[75] Inventor: Lawrence E. Dickens, Baltimore, Md.

[73] Assignee: Westinghouse Electric Corporation, Pittsburgh, Pa.

[22] Filed: Nov. 30, 1973

[21] Appl. No.: 420,480

[52] U.S. Cl. ...................... 330/4.9, 330/53, 330/56, 333/82 B, 333/84 R, 333/84 M

[51] Int. Cl. .............................................. H03f 7/04

[58] Field of Search ...................................... 330/4.9

[56] References Cited

UNITED STATES PATENTS 3,596,197 7/1971 Chorney ............................ 330/4.9

*Primary Examiner*—John Kominski
*Assistant Examiner*—Darwin R. Hostetter
*Attorney, Agent, or Firm*—J. B. Hinson

[57] ABSTRACT

A balanced parametric amplifier, fabricated on a single dielectric substrate, having a pair of Schottky varactor diodes located at the junction of a co-planar transmission line impedance inverter and a slot transmission line formed on one side of the substrate with the pump signal coupled to the slot line. A microstrip transmission line circuit configured as a resonant impedance transformer is formed on the other side of the substrate to which the input signal is applied and from which the amplified output signal is also taken. The microstrip transmission line terminates in a capacitive impedance microstrip section. A microstrip to co-planar transmission line transition is formed at the capacitive impedance section through the dielectric substrate. The two varactor diodes are reactively matched, i.e., resonated, at the signal frequency by means of the co-planar and the microstrip transmission line configurations so that the two varactor diodes appear as a negative impedance to the input signal at the microstrip to co-planar transmission line transition. The combination of the co-planar and slot transmission line configurations additionally includes an idler filter to restrict the idler circuit current to the vicinity of the varactor diodes.

12 Claims, 10 Drawing Figures

PATENTED OCT 1 5 1974

3,842,360

PARAMETRIC AMPLIFIER

BACKGROUND OF THE INVENTION

The invention herein described was partially made in the course of a contract or subcontract thereunder with the Department of the Army.

FIELD OF THE INVENTION

The present invention pertains to a parametric amplifier including means for satisfying the idler circuit resonance requirements with a low loaded Q while maintaining reasonable decoupling to the external pump circuitry. Efficient coupling of the input signal energy to a balanced pair of varactor diodes is obtained such that when the diodes are pumped at the proper frequency, amplification of the input signal will result over a broad range of frequencies about a center signal frequency while minimizing noise from being added to the signal as a result of the amplification process.

Accordingly, the present invention is directed to an improved means of varactor diode coupling whereby the bias and signal energies are supplied to the diodes and whereby the pump and idler circuits are also coupled to the diodes in such a manner that high isolation between the signal circuit, the idler circuit, and the pump circuit is maintained.

DESCRIPTION OF THE PRIOR ART

Parametric amplifiers have been used for many years to obtain low noise amplification of microwave signals. As is well known, the relationship between the frequency of the input signal wave to be amplified $f_s$, the frequency of the pump signal source $f_p$ and the idler frequency $f_i$ is expressed by the equation $f_p = f_s + f_i$. Such amplifiers generally utilize a variable capacitance or varactor diode as the reactance element. The reactance is varied or modulated by a pump signal and an input signal to be amplified is applied thereto. The frequency of the pump signal is generally much higher than the input signal frequency. When the input signal is applied the amplifier develops a difference frequency between the pump and signal frequencies commonly referred to as the idler frequency. The parametric amplifier is also known to utilize a common input and output terminal. As such, a negative input impedance is presented to the input signal whereupon a reflected signal having an amplitude greater than the input signal is provided as an output to the common terminal. In such apparatus, however, a microwave circulator is required to receive the input signal at one port and transfer the output signal to another port. A typical example of this type of amplifier is disclosed in U.S. Pat. No. 3,596,197, P. Charney. Other prior art references worthy of note are:

3,051,844 Beam et al.
3,343,069 Tsuda
3,375,454 Aitchison
3,378,690 Dodson
3,391,346 Uhlir
3,513,403 Chang
3,678,395 Huntan et al.
3,710,268 Neuf
3,731,180 Napoli et al.

Parametric amplifiers additionally utilize ceramically encased or packaged varactor diodes having both a series self resonance and a parallel self resonance, both of which are determined primarily by the package parasitic reactances. The parasitic reactances, however, of the conventional varactor package is not easily controlled, thereby making control of the required resonances relatively difficult where high reliability is required, particularly where such devices are mass produced. Additionally, there is also a continuing need for improvements in such devices which can result in better electrical performance, improved reproducability and lower production costs.

SUMMARY

Briefly, the subject invention is directed to an improved parametric amplifier fabricated on a single dielectric substrate having a co-planar transmission line and a slot transmission line combination formed on one side thereof and with a microstrip transmission line formed on the other side thereof with an electrical feedthrough therebetween. A pair of varactor diodes are located in a balanced configuration on one side of the substrate at the junction of the co-planar and slot transmission line. An inductance strap is formed at the junction of the co-planar and slot transmission line to resonate the diodes and circulate the idler current therebetween when a pump signal is applied to the slot transmission line. The co-planar transmission line has a length substantially one quarter wavelength of the signal frequency and operates as an impedance inverter of the varactor diodes at the point of the electrical feedthrough with the microstrip transmission line on the opposite side of the substrate being configured as a combination of quarter and half wavelength sections of the signal frequency to act as a resonant impedance transformer of the external signal source feeding the input signal to be amplified to the apparatus. The action of the input signal current and the pump current coupled with the voltage dependent capacitance characteristic of the varactor diodes causes the varactors to exhibit a negative resistance to the signal wave resulting in an amplified version of the input signal being reflected and coupled to an external circuit by way of a common transmission line, namely, the microstrip transmission line.

DESCRIPTION OF THE PREFERRED EMBODIMENTS

Figure 1:
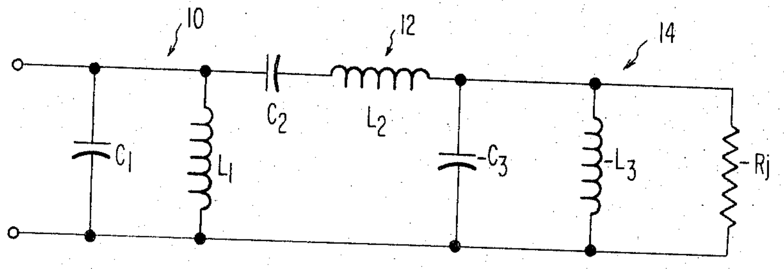
FIG. 1 is an electrical equivalent circuit of a parametric amplifier as embodied by the subject invention.

The present invention is comprised of a single tuned idler circuit but a double tuned signal circuit, the equivalent circuit of which is shown in FIG. 1. The circuit is called double tuned because there are two resonant networks involved and respectively comprised of the parallel combination 10 of the capacitance $C_1$ and the inductance $L_1$ and the series combination 12 of the capacitance $C_2$ and $L_2$. The parallel combination of $C_1$ and $L_1$ represents the broadbanding matching network of the external input signal source coupled to the amplifier whereas the series combination of $C_2$ and $L_2$ represents the combined effect of the signal transmission lines and tuning capacitance provided by varactor diodes. The idler circuit is represented by the network 14 comprised of the parallel configuration of $-C_3$, $-L_3$ and $-R_j$. Under some conditions, a triple tuned response can be obtained.

Figure 3:
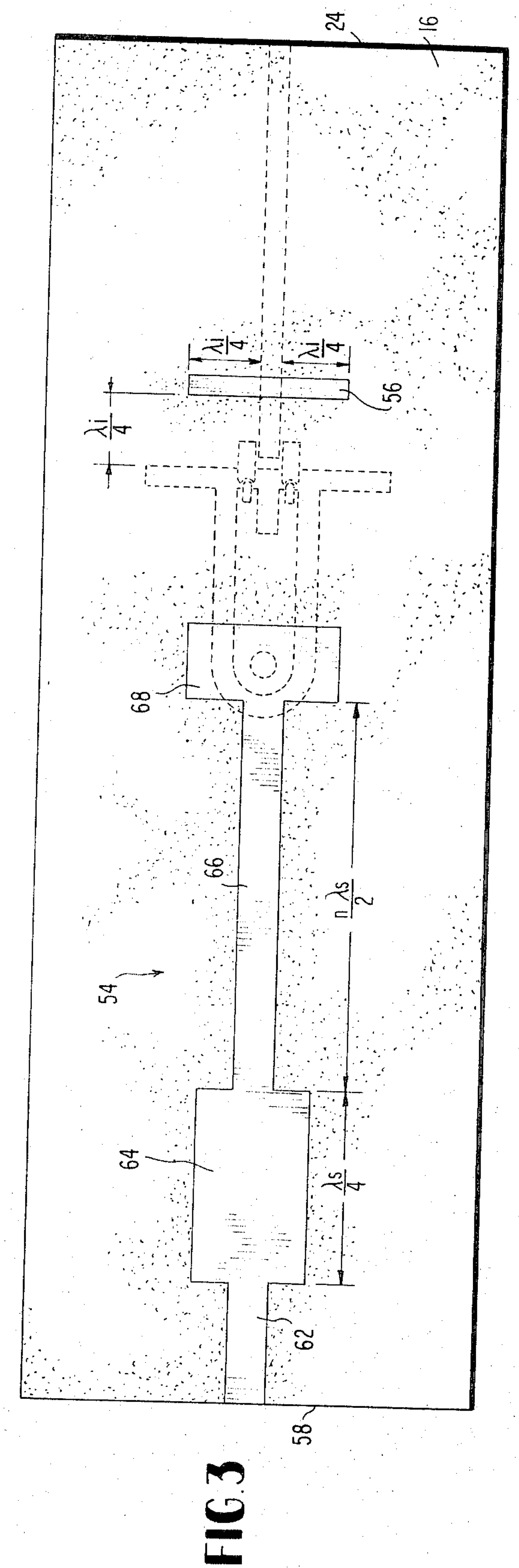
FIG. 3 is a plan view illustrative of the other side of the substrate having the remaining portion of the first embodiment shown in FIG. 1.
Figure 2:
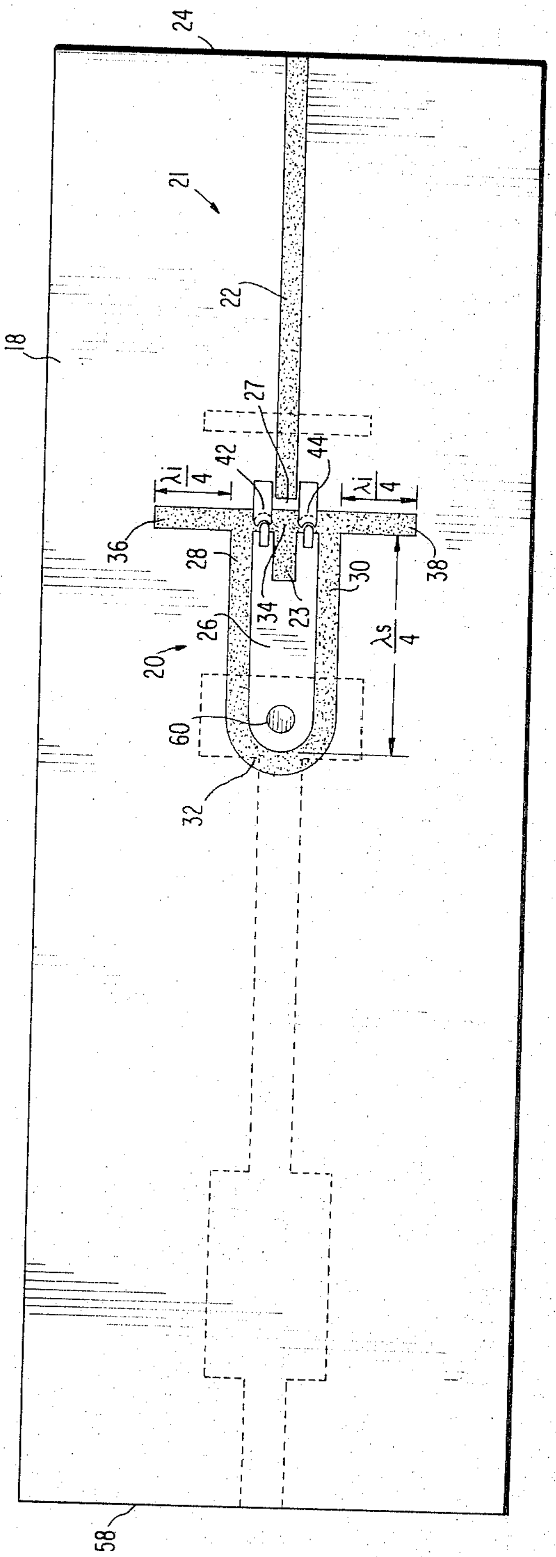
FIG. 2 is a plan view of one side of a dielectric substrate containing a portion of a first embodiment of the subject invention.

Referring now to the first embodiment of the subject invention, reference is now made to FIGS. 2 and 3. The parametric amplifier is fabricated on a single dielectric (alumina) substrate 16. A ground plane is formed over one broad surface of the substrate 16 by electrically conducting film 18 consisting of, for example, chromium-gold. This is shown in FIG. 2. A co-planar transmission line 20 and a slot transmission line 21 are formed in the metallized conducting film 18 by a selected masking and etching of the film deposited on the substrate. The slot transmission line is a surface oriented wave transmission line consisting of a narrow slot or gap in a thin conductive layer or film on one side of a dielectric substrate. The co-planar transmission line is a surface strip transmission line in which all conducting elements, including the ground plane, are on one and the same side of the dielectric substrate. It consists of a strip of thin metallic film deposited on the surface of a dielectric slab with two ground planes running adjacent and parallel to the strip on the same surface.

The slot transmission line 21 is configured as a linear slot of constant width and comprised of two slot portions 22 and 23 running from the edge 24 of the substrate 16 to and joining the conductive strip 26 of the co-planar line 20. The slot line 21 is interrupted by a region 27 of metallization which acts as an inductive strap in a manner to be described subsequently. The co-planar line 20 is shown comprised of the conductive strip 26 separated from the ground plane formed by the metallized film 18 by two parallel gaps or slots 28 and 30 meeting in a circular slot portion 32 at one end and a linear slot portion 34 commonly connecting the slots 28 and 30 at the opposite end. The slot portion 34 intersects the slot line portion 23 of the slot line 21 forming a hybrid junction thereat. Quarter wavelength slot lines 36 and 38 having a length one quarter of the wavelength $\lambda_i/4$ of the idler frequency $f_1$ extend from the slots 28 and 30 and the slot 34 to form a portion of an idler circuit filter. A pair of beam leaded Schottky barrier varactor diodes 42 and 44 are located at the hybrid junction formed by junction of the slots 23 and 34 on either side of the slot line 23. One terminal of the diodes 42 and 44 is attached to the conductive strip 26 of the co-planar line 20 while the other terminal is connected to the metallized film 18 adjacent the region 27 associated with the slot line 21.

Figure 4:
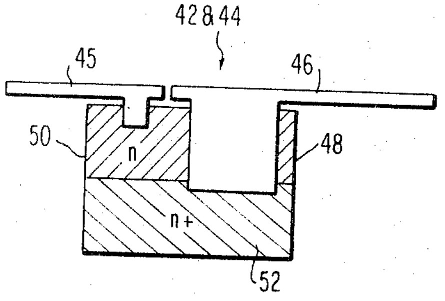
FIG. 4 is a longitudinal cross sectional view being illustrative of a beam leaded diode utilized in connection with the first embodiment of the subject invention.

Referring now to FIG. 4, the beam leaded varactor diodes are shown including a pair of beam leads 45 and 46 contacting a semiconductor body 48. The semiconductor body 48 is comprised of an epitaxial layer 50 of gallium arsenide having n type semiconductivity contiguous with a layer 52 of gallium arsenide having *n*+ semiconductivity. The beam lead 45 projects into the layer 50 while beam lead 46 projects through the n type layer 50 and into the *n*+ type layer 48.

The dielectric substrate 16 provides a support not only for the co-planar and slot transmission lines 20 and 21 on the side shown in FIG. 2 but also as a support for a microstrip transmission line 54 on the opposite side as shown in FIG. 3. The ground plane for the microstrip line 54 is supplied by the film of metallization 18 on the other side of the substrate. In addition to the microstrip transmission line 54, a linear conductive strip 56 forming the second portion of the idler filter circuit is fabricated on the same side of the substrate.

The slot line 21 is used for coupling the pump energy wave from a source not shown to the varactor diodes 42 and 44. The conductive strip 56 extends a quarter wavelength $\lambda_i/4$ of the idler frequency on either side of the slot line 22 and is also separated by a quarter wavelength $\lambda_i/4$ of the idler frequency from the diodes 42 and 44. As noted above, the slot line portions 36 and 38 also extend from the slots 28 and 30, respectively, a quarter of a wavelength $\lambda_i/4$ of the idler frequency. The slot line portions 36 and 38 act as quarter wavelength stubs for preventing idler currents from being transmitted to the input signal circuitry whereas the microstrip 56 prevents idler currents from being transmitted to the pump source.

The microstrip circuit 54 as shown in FIG. 3 extends from the edge 58 of the substrate 16 to the co-planar line 20 on the opposite side of the substrate, being coupled thereto by means of a metallization element 60 which extends from one surface of the substrate to the other and effecting a transition from the microstrip transmission line 54 to the coplanar transmission line 20. The microstrip line 54 includes a first line section 62 which is adapted to be coupled to an external circuit such as a circulator, not shown. The section 62 couples into a second line section 64 of metallization having a generally rectangular configuration of greater width than the first section 62 and having a length substantially equal to a quarter wavelength of the input and output signal, i.e., $\lambda_s/4$. Following the second section 64 is a third line section 66 of substantially equal width as the first section 62 but having a relatively longer length and more specifically a length equal to multiple half wavelengths of the input and output signal, i.e., $n\lambda_s/2$ where n is an integer. Following section 66, the microstrip circuit 54 terminates in a relatively short low impedance line section 68 having a relatively wider width than the transmission lines 62 and 66 and being located opposite the slot portion 32 of the co-planar line 20 on the other side of the substrate 16 with the metallization feedthrough element 60 being centrally located therebetween. The combination of the quarter wavelength section 64 and the half wave section 66 acts as an impedance transformer for transforming the impedance of the external circuitry coupled to section 62 to the relatively low impedance of microstrip section 68 which operates as a capacitance that is parallely resonant with the average or pumped reactance of the varactor diodes 42 and 44 as transformed to the feedthrough element 60 by means of the co-planar line 20. The microstrip sections 64 and 66 are designed to have a frequency versus impedance characteristic of the external signal circuit impedance transformation to the section 68 of a series resonant circuit, the loaded Q of said equivalent series resonant circuit being selected to provide a desired gain-bandpass characteristic.

In operation, the RF signal to be amplified is coupled by means of the microstrip circuitry 54 and the coplanar circuitry 20 on the other side of the substrate 16 to the varactor diodes 42 and 44. Pump power is supplied by means of the slot line 22 to the hybrid junction of the slot line 22 and the co-planar line 20 producing a field therein which causes a flow of electrical charge within the varactor diodes 42 and 44 at the frequency of the pump energy $f_p$. The interaction of the input signal current and the pump current, coupled with the voltage dependent capacitance characteristic of the varactor diodes 42 and 44, causes the varactors to exhibit a negative resistive impedance to the input signal resulting in an amplified version of the incident signal applied to microstrip section 62 being reflected back thereto for transmittal to an external circuit. The slot line sections 36 and 38 prevent the transmission of pump or idler energy into the co-planar line 20.

As noted above, the microstrip sections 64 and 66 comprise a quarter wave section and multiple half-wave section, respectively, to transform the external circuit impedance to a relatively low value at the position of the transition member 60. It should also be pointed out that the half wave section 66 is used to effect the input signal circuit tuning of a doubly tuned configuration by setting the length of the section 66 to the proper multiple n and by selecting the proper characteristic impedance. The microstrip section 68 acts as a capacitive tab required for signal reactive tuning. The conductive strip 26 of the co-planar line 20 has a length equal to a quarter wavelength $\lambda_s/4$ of the signal frequency and operates as an impedance inverter for transforming the series varactor diode impedance low resistance and high capacitive reactance to an admittance at the transition provided by the feedthrough element 60 at which point the transformed diodes appear as a high shunt resistance in parallel with a relatively low value of shunt inductive reactance. This shunt inductive reactance is tuned out by the effect of the capacitive tab section 68 while the desired amount of overcoupling is obtained by shunting the high shunt resistance term from the varactor diodes 42 and 44 with a much lower value provided by microstrip section 64.

The idler currents generated within the diodes are circulated in the immediate vicinity of the diodes only. As mentioned above, the circuit elements 36, 38 and 56 are utilized to provide idler isolation. The metallization region 27 between the slot line 22 and the slot 34 intermediate the diodes 42 and 43 as shown in FIG. 2, acts as an inductive strap which in combination with the inductance due to the slot portion 23 acts to resonate the diodes and circulate the idler current. The ratio of the inductance due to the slot 23 and the inductive strap 27 across the slot is selected to resonate the diodes at the idler frequency while allowing reasonable coupling of the pump wave energy into the diodes.

Figure 5:
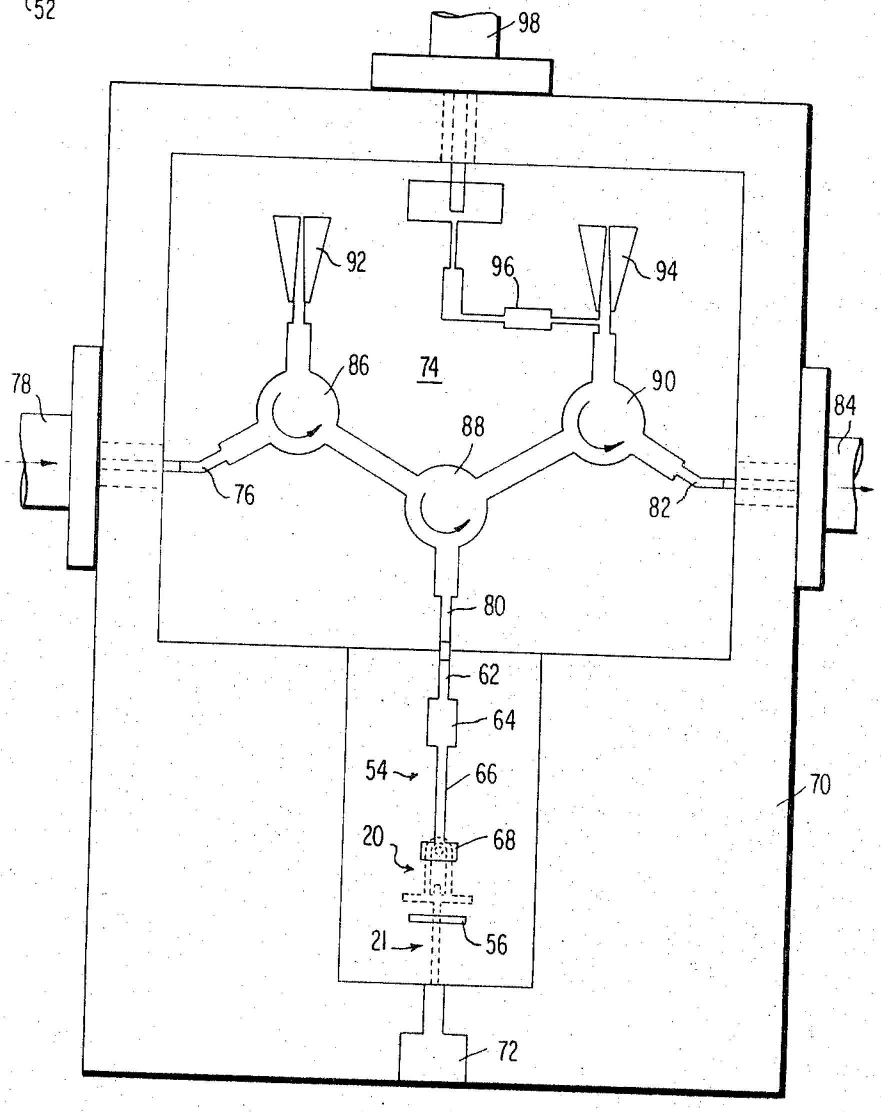
FIG. 5 is a plan view of the first embodiment of the subject invention shown in FIGS. 2 and 3 coupled to a microwave circulator adapted to be used in connection with the subject invention for signal translation purposes.

Referring now to FIG. 5, there is disclosed the manner in which the parametric amplifier described with respect to FIGS. 2 and 3 is utilized. The parametric amplifier as fabricated on the substrate 16 is contained in a housing 70 having a waveguide to slot line transition 72 for the coupling of pump energy to the slot line 21. The microstrip section 62 which receives and transmits an amplified signal therefrom is coupled to a microwave circulator 74 illustrated as a five port ferrite circulator also included in the housing 70. The circulator input port 76 is coupled to an input signal connector 78 for receiving a signal to be amplified. The input signal is transmitted from circulator port 76 to port 80 which couples a signal into the parametric amplifier. The amplified signal is returned to port 80 where it is then coupled to an output port 82 which in turn is coupled to an output signal connector 84. The five port circulator is comprised of three circulator sections 86, 88 and 90. As shown, circulator sections 86 and 88 share a common port as does circulator sections 88 and 90. Accordingly, a suitable microwave signal termination 92 is coupled to the remaining port of circulator section 86. A suitable termination 94 is also coupled to the remaining port of circulator 90; however, in addition to the termination, a bias insertion circuit 96 is also coupled to the port and being additionally connected to an output connector 98 for the application of a bias potential for the varactor diodes 42 and 44.

A second embodiment of the subject invention is shown in FIGS. 6 through 10. This embodiment is similar to the first embodiment in that pump energy is transmitted to a pair of varactor diodes by way of a slot transmission line while the input and output signal is translated by means of a microstrip transmission line coupling to a co-planar transmission line by means of a metallization feedthrough; however, in the instant embodiment, the varactor diodes take the form of a pair of Schottky barrier diodes contained on a "chip" rather than being of the beam leaded type.

Figures 6, 7:
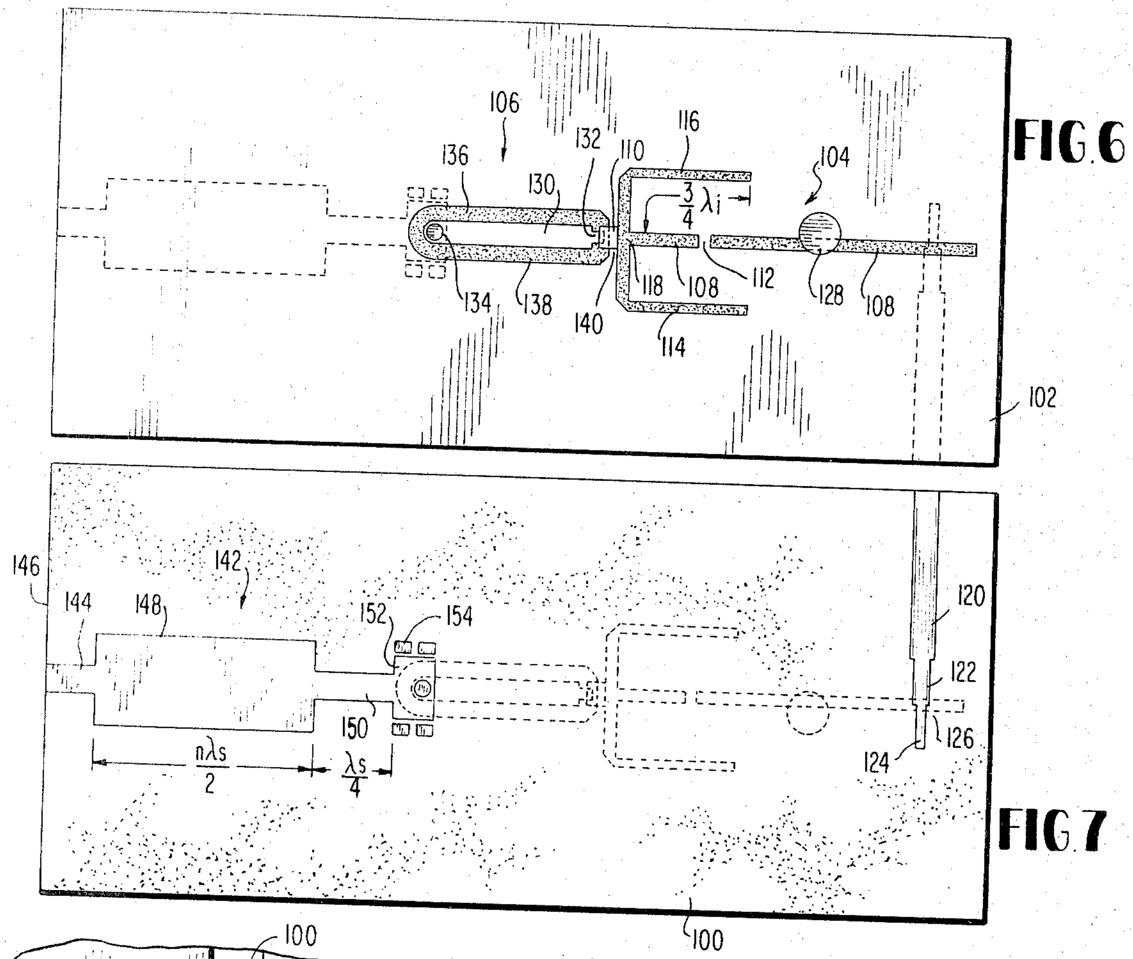
FIG. 6 is a plan view of one side of a dielectric substrate containing a first portion of a second embodiment of the subject invention.
FIG. 7 is a plan view of the other side of the dielectric substrate shown in FIG. 6 and containing the remaining portions of the second embodiment of the subject invention.

Considering the second configuration in more detail reference is now made to FIGS. 6 and 7 wherein the embodiment includes a substrate 100 on one side of which is deposited a thin metallic film 102 with a slot line circuit 104 and a co-planar line 106 formed therefrom by well known fabrication techniques. The slot line circuitry 104 is comprised of a linear slot 108 for coupling pump energy to a pair of varactor diodes contained on a "flip-chip" member 110 shown in detail in FIGS. 8 and 9. The "flip-chip" method of fabricating semiconductor devices is well known to those skilled in the art. The slot line 108 is interrupted by a narrow area of metallization 112, a predetermined distance away from the varactor chip 110 in order to obtain the initial pump diode pump resonance and first order pump impedance matching. A slot line resonant idler filter consisting of a short circuited slot line and comprised of two slots 114 and 116 having a substantially right angle bend therein such that a portion of the slot runs substantially parallel to the slot line 108 vertically joins slot 108 at a junction 118. The length of the idler filter slots 114 and 116 from the junction 118 is a length which is three quarters of a wavelength of the idler frequency i.e., $\frac{3}{4}\lambda_i$. The pump energy is coupled to the slot line 108 by means of a strip line circuit element 120 deposited on the opposite side of the substrate 100, with the terminal sections 122 and 124 being selectively narrowed to provide a desired microstrip to slot line transition at the location 126. Second order or fine tuning pump matching is obtained by means of a dielectric or capacitive loading element of the slot 108 by means of a small movable metallic disc 128 which is adapted to act much like the conventional slide screw tuner. The size and position of the disc is determined by experimentation.

As noted above, co-planar waveguide consists of a strip of thin metallic film deposited on the surface of the dielectric substrate with the two ground planes running adjacent and parallel to the strip on the same surface. Accordingly, the co-planar line 106 shown in FIG. 6 consists of the strip transmission line 130 terminating at one end in a narrowed down portion 132 for contact with the varactor chip 110 while the other end terminates in a metallization feedthrough element 134. The strip 130 is separated from the metallization on each side by parallel slots 136 and 138, thus appearing as two parallel slot lines having common end terminations. The metallization area 140 under the varactor chip 110 acts as an inductive strap across the hybrid junction existing between the slot line 108 and co-planar line 106 to provide idler circuit resonance and restricting the idler current loop to the vicinity of the varactor diodes.

Referring now more particularly to FIG. 7, the signal to be amplified is fed to the varactor diodes contained on the chip 110 by means of a microstrip circuit 142 deposited on the opposite side of the substrate 100. In the present embodiment, however, the geometric parameters associated with the microstrip circuitry 142 is different from the first embodiment. Whereas the first section 144 extends to the outer edge 146 of the substrate 100 in the same manner as previously described, the second section 148 instead of being a quarter wavelength in length is now made to be a selected multiple of a half wavelength while the adjoining narrow section 150 is made a quarter of a wavelength. The microstrip circuitry 142 again terminates in a capacitive tab section 152 which is in contact with the feedthrough transition metallization element 134. As before, the length of the co-planar line 106 is made to be a quarter of a wavelength of the input signal frequency. As in the first embodiment, the co-planar transmission line 106 acts as an impedance inverter to the transition metallization element 134. The capacitive tab section 152 which provides a shunt tuning capacitance now additionally includes a fine tuning capability by means of one or more relatively small microstrip areas 154. The co-planar line 106 transforms or inverts the varactor impedance to an admittance at the transition 134 as in the first embodiment, but now the relatively narrow microstrip section 150 acts as the impedance transformer to the external circuit while section 148 acts as a second resonator. This configuration still results in a double tuning which occurs since the second resonator section 148 being multiple half wavelengths long and of a predetermined characteristic impedance causes the signal source impedance at the junction of sections 148 and 150 to resemble that of a simple parallel tuned RLC circuit. The adjacent section 150 acts as a quarter wave impedance transformer to provide an impedance inversion so that the signal source impedance at the transition 134 resembles the simple series tuned RLC circuit which combines with the parallel resonance of the first resonator section provided by section 152 to produce the required double tuned response.

Figure 8:
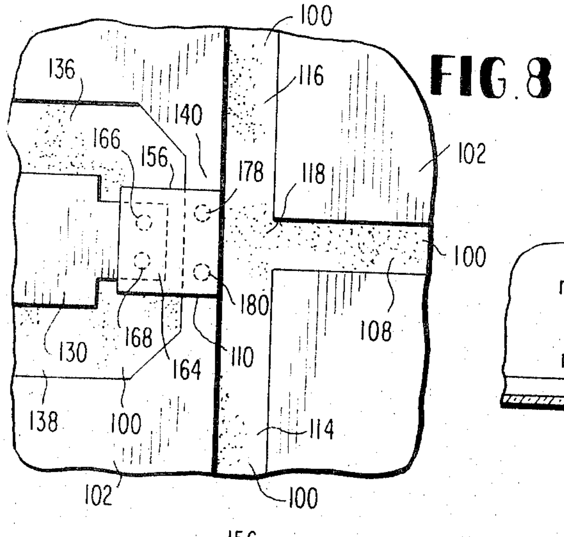
FIG. 8 is an enlarged fragmentary view of a portion of the second embodiment shown in FIG. 6.
Figure 9:
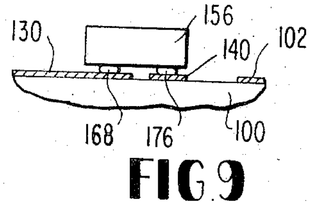
FIG. 9 is a fragmentary side elevation view of the portion of the second embodiment shown in FIG. 8.
Figure 10:
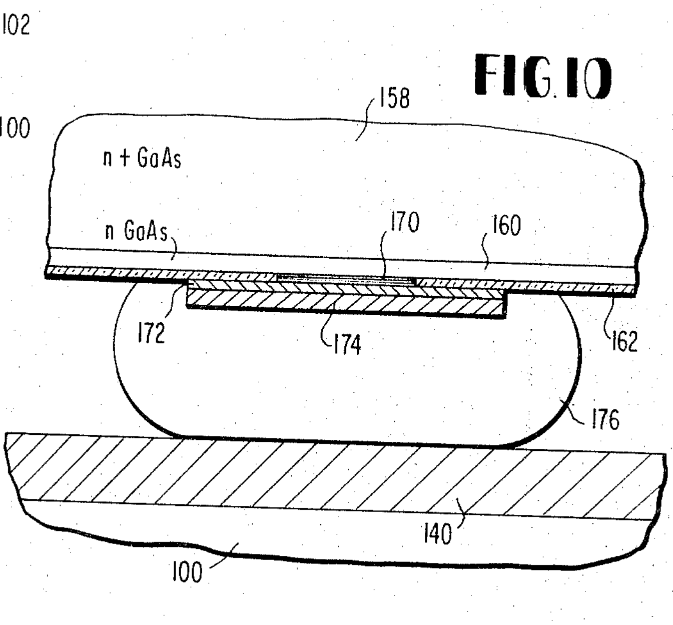
FIG. 10 is an enlarged cut-away view of the apparatus shown in FIG. 9.

Whereas in the first embodiment of the subject invention a pair of beam leaded Schottky barrier diodes were utilized, the present embodiment has for its objective the use of a pair of Schottky barrier diodes fabricated on a semiconductor "chip". The details of the varactor diode "chip" is shown in FIGS. 8 and 9 while FIG. 10 discloses a cross sectional view of a Schottky barrier diode formed on the chip. First considering the chip itself, it consists of a body 156 of semiconductor material, preferably gallium arsenide. The body 156 consists of a substrate 158 doped with *n*+ impurity dopants over which an epitaxial layer 160 having n type semiconductivity is grown. Over the epitaxial layer 160 is formed a film of dielectric material such as silicon dioxide 162. The body 156 is formed as a well known "flip-chip" device which faces downward toward the carrier circuit. Accordingly, a relatively large ohmic contact area 164 (FIG. 8) is formed through an opening in the silicon dioxide layer 162 and contacting the *n*+ layer 158 with a pair of gold contact pads 166 and 168 formed on the ohmic contact area.

A Schottky barrier is fabricated in an opening in the silicon dioxide dielectric layer 162 with an overlay comprising a chromium adherence layer 172 and gold layer deposited by a vapor process 174 applied to the chromium layer 172. Next a gold contact pad 176 similar to the contact pads 166 and 168 are formed around the diodes 178 and 180. The pads 176 of the diodes 178 and 180 are bonded to the inductive strap metallization area 140 shown in FIG. 6 while the contact pads 166 and 168 are bonded to the metallic film 130 of the co-planar transmission line 106. The effective series resistance of the diodes is reduced to a minimum by the utilization of the relatively large ohmic contact area 164. It is the ease of fabrication of the Schottky diode which makes the present embodiment particularly desirable.

Thus what has been shown and described is a hybrid parametric amplifier utilizing a pair of balanced varactor diodes operated with a combination of microstrip and co-planar waveguide for signal tuning and matching to the varactors and slot transmission line for pump transmission and idler isolation. In one embodiment, a pair of beam leaded varactor diodes are utilized whereas in the second embodiment, a pair of Schottky barrier diodes fabricated on a semiconductor chip are utilized.

While the foregoing detailed description of the embodiments has been set forth with a certain degree of particularity, it should be pointed out that this disclosure has been by way of explanation only, and is not meant to be interpreted in a limiting sense. It is therefore desired that all alterations and modifications coming within the scope and breadth of the claims following hereinafter are meant to be included.

I claim:

1. A balanced parametric amplifier including varactor diode means, comprising in combination:

a planar substrate of dielectric material;

an electrically conductive film on one side of said substrate;

a pump circuit for supplying pump energy to said varactor diode means from an external source, formed on said one side of said substrate and being characterized by a slot transmission line of a selected length formed in said film and having a discontinuity intermediate said length for exhibiting an inductive reactance characteristic in said slot line to match the impedance of the external pump source coupled to said slot line to said varactor diode means;

a signal circuit for commonly coupling a signal to and from said varactor diode means and transforming the impedance of an external signal circuit coupled thereto and said varactor diode means to a common point of relatively low impedance and for obtaining a double tuned gain-bandpass characteristic, being characterized by, (1) a co-planar transmission line formed in said conductive film on said one side of said substrate and having one end electrically coupled to said slot line to form a hybrid junction and having a length substantially equal to one quarter wavelength of the signal to be amplified for effecting an impedance inversion of impedance of said varactor diodes to said common point of relatively low impedance, (2) co-planar to microstrip transition means formed through said substrate to the opposite side thereof at the other end of said co-planar transmission line, said transition effectively embodying said common point, and (3) a microstrip transmission line formed on said opposite side of said substrate and including a first line portion of selected geometry for reducing the magnitude of the load impedance provided by said external signal circuit to a predetermined magnitude, a second line portion of selected geometry providing a resonator tuned to the input signal frequency, and a third line portion located at said transition means being of a selected geometry for providing a relatively low reactance that parallely resonates with the reactance of said varactor diode means as transformed by the impedance inverting action of said co-planar transmission line to said transition means;

said varactor diode means comprising a pair of varactor diodes located at said hybrid junction in balanced circuit relationship;

an idler circuit including an area of conductive film on said one side of said substrate coupling said pair of varactor diodes for permitting an idler current to flow therebetween; and an idler filter circuit comprising planar circuit means formed on said substrate adjacent said varactor diodes for preventing the idler current to flow to said pump circuit and said signal circuit.

2. The parametric amplifier as defined by claim 1 wherein said pair of varactor diodes are comprised of a pair of Schottky barrier diodes.

3. The parametric amplifier as defined by claim 1 wherein said pair of varactor diodes are comprised of a pair of beam leaded Schottky barrier diodes.

4. The parametric amplifier as defined by claim 1 wherein said varactor diode means comprises a pair of Schottky barrier diodes fabricated on a "flip-chip" semiconductor chip, said chip having a relatively large ohmic contact area adjacent said pair of diodes, and wherein said ohmic contact area is electrically connected to said co-planar transmission line, said pair of diodes thereby being connected between metallization of said co-planar transmission line and metallization adjacent said slot line.

5. The parametric amplifier as defined by claim 1 wherein said co-planar transmission line has a length substantially equal to one quarter wavelength of the signal to be amplified for effecting an impedance inversion of the varactor diode means to said common point of relatively low impedance.

6. The parametric amplifier as defined by claim 1 wherein said idler filter circuit comprises:

a first and second linearly aligned slot transmission line in said conductive film intersecting said co-planar transmission line in the region of said hybrid junction and said pair of varactor diodes and respectively having a slot length in the order of one quarter wavelength of the idler circuit frequency; and a relatively linear microstrip transmission line formed on said opposite side of said substrate substantially a quarter wavelength of said idler frequency away from said varactor diode means and running transversely to said pump circuit and extending substantially a quarter wavelength of said idler frequency on either side of said pump circuit.

7. The parametric amplifier as defined by claim 1 wherein said idler filter circuit comprises a first and a second angulated slot transmission line in said conductive film, each having a first slot portion intersecting said hybrid junction and a second slot portion extending substantially parallel to the slot transmission line of said pump circuit.

8. The parametric amplifier as defined by claim 7 wherein said first slot portion of said angulated slot transmission line forming said idler filter circuit intersects said hybrid junction adjacent said pair of varactor diodes, and wherein said first and second slot portions extend substantially at right angles to one another.

9. The parametric amplifier as defined by claim 8 wherein the combined length of the first and second slot portions of each of said angulated slot line transmission lines forming said idler filter circuit is in the order of ¾ wavelength of the idler circuit frequency.

10. A parametric amplifier as defined by claim 7 wherein said slot transmission line of said pump circuit additionally includes a capacitive loading element which is selectively movable to provide selective tuning of said pump circuit, and a microstrip transmission line formed on said opposite side of said substrate having a selectively decreasing geometry crossing said pump circuit on said one side of said substrate and acting as a microstrip to slot line transition for coupling pump energy to said pump circuit.

11. The parametric amplifier as defined by claim 1, wherein said first line portion of said microstrip transmission line of said signal circuit comprises transmission line means having a length in the order of a quarter wavelength of said signal frequency and having a width dimension greater than said second line portion, and wherein said second line portion comprises a relatively narrower microstrip transmission line having a length in the order of a predetermined multiple of one half wavelengths of the signal frequency.

12. The parametric amplifier as defined by claim 1, wherein said first line portion of the microstrip transmission line of said signal circuit comprises a transmission line of relatively narrow width dimension and having a length in the order of one quarter wavelength of the signal frequency, and wherein said second line portion of said microstrip transmission line comrpises a transmission line having a width dimension greater than said first line portion and having a length in the order of a predetermined multiple of one half wavelengths of said signal frequency.

* * * * *